US012795846B2

(12) United States Patent
Jade et al.

(10) Patent No.: US 12,795,846 B2
(45) Date of Patent: Nov. 10, 2026

(54) COVER FOR ELECTRICAL DEVICES

(71) Applicant: Sigma Engineered Solutions, Garner, NC (US)

(72) Inventors: Prashant Jade, Pune (IN); Kamlesh Kumar Dadwariya, Pune (IN)

(73) Assignee: Sigma Engineered Solutions, Garner, NC (US)

( * ) Notice: Subject to any disclaimer, the term of this patent is extended or adjusted under 35 U.S.C. 154(b) by 47 days.

(21) Appl. No.: 18/981,576

(22) Filed: Dec. 15, 2024

(65) Prior Publication Data

US 2025/0203796 A1 Jun. 19, 2025

Related U.S. Application Data

(60) Provisional application No. 63/609,982, filed on Dec. 14, 2023.

(51) Int. Cl.

| | |
|---|---|
| ***H05K 5/03*** | (2006.01) |
| ***H02G 3/08*** | (2006.01) |
| ***H02G 3/14*** | (2006.01) |
| ***H05K 5/02*** | (2006.01) |

(52) U.S. Cl.

CPC ............... *H05K 5/03* (2013.01); *H02G 3/081* (2013.01); *H02G 3/14* (2013.01); *H05K 5/0217* (2013.01)

(58) Field of Classification Search

CPC ........ H05K 5/03; H05K 5/0217; H02G 3/081; H02G 3/086; H02G 3/088; H02G 3/14

See application file for complete search history.

(56) References Cited

U.S. PATENT DOCUMENTS

| | | | | |
|---|---|---|---|---|
| 3,449,706 A * | 6/1969 | Carissimi | H01R 13/5227 | 174/67 |
| 7,396,996 B1 * | 7/2008 | Shotey | H02G 3/14 | 174/67 |
| 7,619,163 B1 * | 11/2009 | Shotey | H02G 3/14 | 174/67 |
| 8,053,671 B1 * | 11/2011 | Shotey | H02G 3/14 | 174/67 |
| 10,199,814 B2 * | 2/2019 | Mortun | H02G 3/081 | |
| 10,742,010 B1 * | 8/2020 | Baldwin | H02G 3/14 | |
| 2018/0048132 A1 * | 2/2018 | Dinh | H02G 3/18 | |
| 2019/0190243 A1 * | 6/2019 | Mullen | H02G 3/088 | |
| 2021/0359477 A1 * | 11/2021 | Smith | H01R 24/68 | |

* cited by examiner

*Primary Examiner* — Daniel J Rohrhoff

(74) *Attorney, Agent, or Firm* — Vani Moodley, Esq.

(57) ABSTRACT

The present invention provides a cover assembly (100) for an electrical device (200). The cover assembly (100) includes a base, a lid, and a flexible element. The base (10) is adapted to be attached to the electrical device (200), and the base (10) is having an opening (11) to receive the electrical device (200) there through. The lid (20) is having a lid ring (22) and a cover (24). The cover (24) is slidably arranged on the lid ring (22) using a slide mechanism (25) to configure an open lid position or a closed lid position. Further, the flexible element (30) is arranged between the base (10) and the lid ring (22) of the lid (20), adapted to configure an expanded position to move the lid (20) away from the base (10) and a retracted position to flush the flexible element within the base (10).

14 Claims, 9 Drawing Sheets

COVER FOR ELECTRICAL DEVICES

TECHNICAL FIELD

The present invention relates to an electrical device. More specifically, the present invention relates to a cover assembly for an electrical device.

BACKGROUND

It is important to consider the challenges faced by electrical equipment situated in outdoor environments, such as those mounted on exterior walls. These installations are particularly susceptible to potential exposure to water and various pollutants, which can jeopardize their functionality and safety. To address these concerns, protective cover designs have been developed, commonly known as “while-in-use” covers. While these covers are primarily designed to safeguard electrical devices, including outlets, switches, and communication ports, from environmental hazards, it’s noteworthy that they can be valuable even when the devices are not actively connected to electrical connectors. These covers typically feature a hinge mechanism that enables the lid to move in relation to a base, providing a practical solution for accessing and protecting electrical equipment in outdoor settings. This background information underscores the significance of while-in-use covers in the field of electrical equipment protection.

Furthermore, it’s worth noting that the hinged connection between the base and the lid offers a restricted range of motion for the lid. This limited range of motion, in turn, results in reduced accessibility of the electrical device for the user. This aspect underscores the need for advancements in the design of while-in-use covers to enhance user accessibility and convenience.

Therefore, there is a need for a cover assembly for an electrical device, which overcomes the problems of the prior art.

STATEMENT OF THE INVENTION

An object of the present invention is to provide a cover assembly for an electrical device.

Another object of the present invention is to provide a cover assembly for an electrical device, which provides easy accessibility of the electrical device to the user.

Yet another object of the present invention is to provide a cover assembly for an electrical device, which protects the electrical device from environmental hazards.

Still another object of the present invention is to provide a cover assembly for an electrical device, which is easy to install and use.

According to one aspect of the present invention, there is provided a cover assembly for an electrical device. The cover assembly may include a base, a lid, and a flexible element. The base may be adapted to be attached to the electrical device. The base may be having an opening to receive the electrical device there through.

The lid may be having a lid ring and a cover. The cover may be slidably arranged on the lid ring using a slide mechanism to configure an open lid position or a closed lid position. The slide mechanism may include a guide arranged on the lid ring, and an engaging portion provided on the cover to engage with the guide of the lid ring to enable sliding of the cover in a longitudinal direction. The cover may be slidable from the closed lid position to the open lid position in a longitudinal direction upon applying an external force. Upon releasing the external force, a biasing member enables the cover to move towards the closed lid position from the open lid position.

The biasing member may include at least one spring with one end connected to the lid ring and another end connected to the cover in such a way that the cover is biased in the closed lid position. In the present aspect, the spring may be a tension spring with one end fixed at a first longitudinal end of the lid ring, and another end is connected to an edge of the cover near the first longitudinal end of the lid ring, thereby exerting a pulling force on the cover to configure the closed lid position.

In another aspect, the spring may be a compression spring with one end fixed at a second longitudinal end of the lid ring, and another end is connected to an edge of the cover near a first longitudinal end of the lid ring, thereby exerting a pushing force on the cover to configure the closed lid position.

In one aspect, the lid ring may include at least one engagement tab configured to engage with at least one locking tab arranged on the base to secure the flexible element in the retracted position within the base.

In another aspect, the cover may include a stopper arranged at an edge to restrict the movement of the cover at the open lid position while moving in a longitudinal direction from the closed lid position.

Further, the base may be adapted to receive a gasket on a rear surface, the gasket is attached to the base in such a way that the gasket is in contact with the electrical device to provide the sealing therebetween.

The flexible element may be arranged between the base and the lid ring of the lid. The flexible element may be adapted to move the lid away from the base to configure an extended position, forming a space to accommodate a connector connected to the electrical device. Further, the flexible element may be adapted to retract the lid towards the base to configure a retracted position and flush the flexible element within the base.

Furthermore, in another aspect, the base may include at least one tab extending from the rear face around the opening to secure the adapter plate thereon. The adapter plate may include at least one recessed portion corresponding to the tab arranged on the base to allow insertion of the adapter plate within the tab. In the present aspect, the base includes four tabs, each longitudinal side of the base includes two tabs. The adapter plate includes four recessed portions, each longitudinal side of the adapter plate includes two recessed portions corresponding to the position of the tabs of the base.

A method is provided to attach the adapter plate to the base. First, the adapter plate may be slid through tabs arranged on the base. In the next step, the adapter plate may be pressed against the base when the adapter plate reaches the bottom of the base. Specifically, the adapter plate includes recessed portions configured to facilitate snap-fit with the tabs of the base.

BRIEF DESCRIPTION OF THE DRAWINGS

Other features and advantages of the invention will become apparent when reading the detailed description given below, purely by way of example and in a non-limitative manner, referring to the following figures.

DETAILED DESCRIPTION

An embodiment of this invention, illustrating its features, will now be described in detail. The words "comprising, "having, "containing," and "including," and other forms thereof, are intended to be equivalent in meaning and be open ended in that an item or items following any one of these words is not meant to be an exhaustive listing of such item or items or meant to be limited to only the listed item or items.

The terms "first," "second," and the like, herein do not denote any order, quantity, or importance, but rather are used to distinguish one element from another, and the terms "an" and "a" herein do not denote a limitation of quantity, but rather denote the presence of at least one of the referenced item.

The disclosed embodiments are merely exemplary of the invention, which may be embodied in various forms.

The present invention provides a cover assembly for an electrical device. The cover provides easy access to the electrical device to the user. The cover provides a protection shield for electrical devices that are exposed to environmental hazards such as water, dust, and pollution. Further, the cover is easy to install and use.

Figure 1:
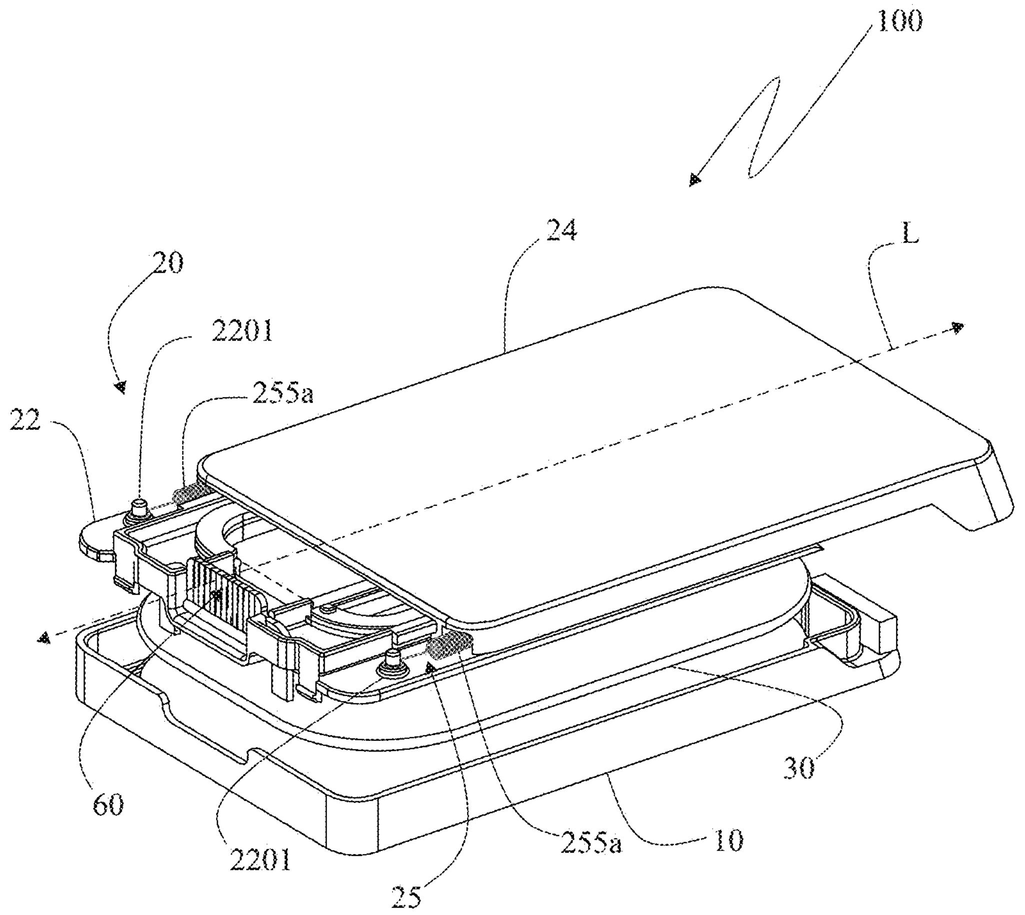
FIG. 1 illustrates a perspective view of a cover assembly for an electrical device in accordance with an embodiment of the present invention.
Figure 2:
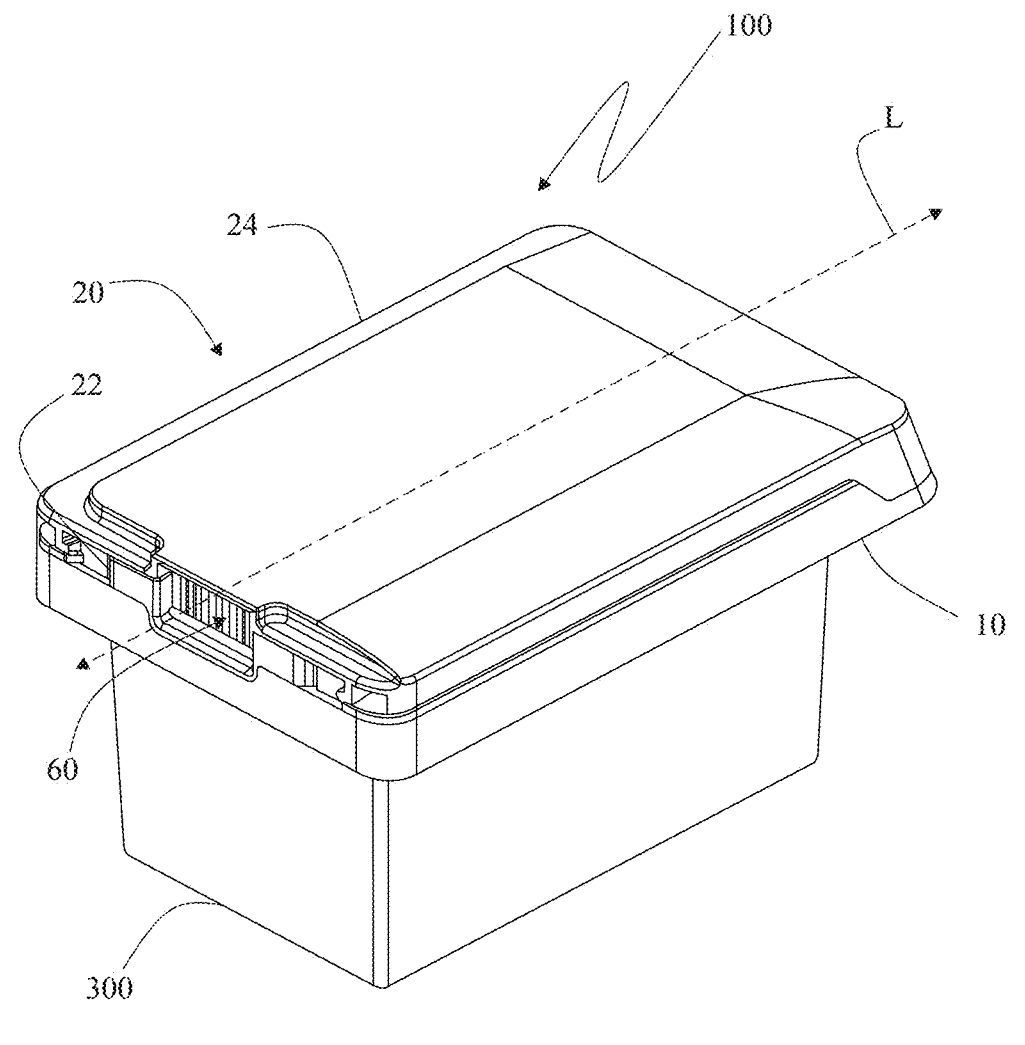
FIG. 2 illustrates a perspective view of the cover assembly in a closed lid position.
Figure 3:
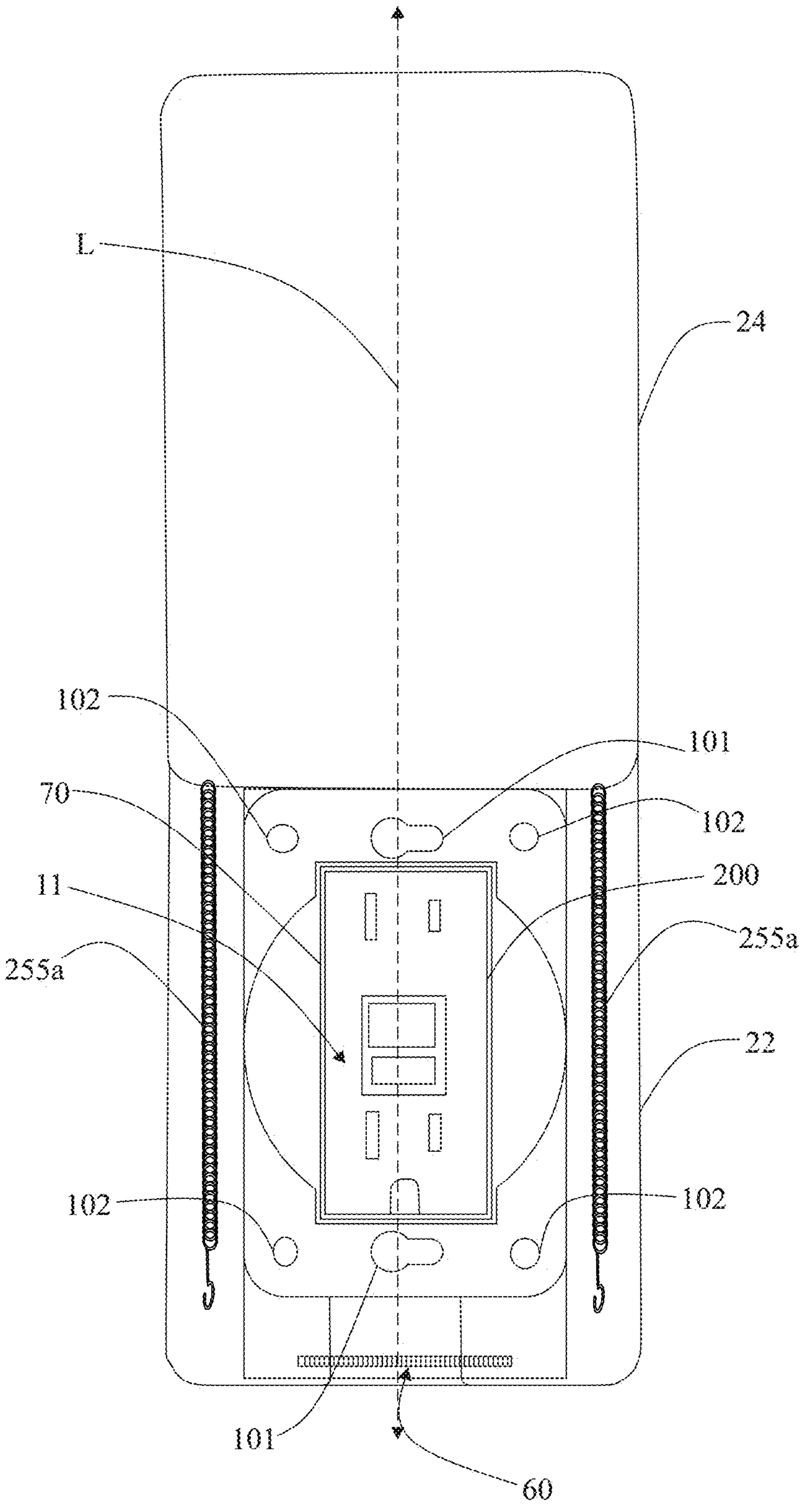
FIG. 3 illustrates a top view of the cover assembly for an electrical device in accordance with the present invention.

Referring now to FIGS. 1, 2 and 3, a cover assembly (100) for an electrical device (200) in accordance with the present invention is illustrated. The cover assembly (100) is adapted to be mounted over the electrical device (200) to protect the electrical device (200) from environmental hazards. In an aspect, the electrical device (200) is placed in an electrical box (300) and the cover assembly (100) is secured onto the electrical box (300) aligned over the electrical device (200) to protect it from severe weather conditions. It may be obvious for a person skilled in the art to place multiple electrical devices in the electrical box (300). In another aspect, the cover assembly (100) can be used for any electric outlet box such as weatherproof electric boxes, junction boxes and the like.

The cover assembly (100) includes a base (10), a lid (20), and a flexible element (30). The base (10) is adapted to be arranged on the electrical device (200). The base (10) is attachable to the electrical device (200) through the mounting holes (101) and to the electrical box (300) through the holes (102) provided on the base (10), which attach the cover assembly (100) to the electrical box (300) over the electrical device (200). The base (10) has a rectangular shape. In an alternative embodiment, the shape of the base (10) can be any other shape configured according to the user's requirement. The base (10) includes an opening (11) to receive the electrical device (200) therethrough. The opening (11) is having a rectangular shape to access the electrical device (200) for connecting a connector (50) (shown in FIG. 5). The connector (50) is having a cord (55) extending away out of the cover assembly (100) when connected to the electrical device (200).

Figure 4:
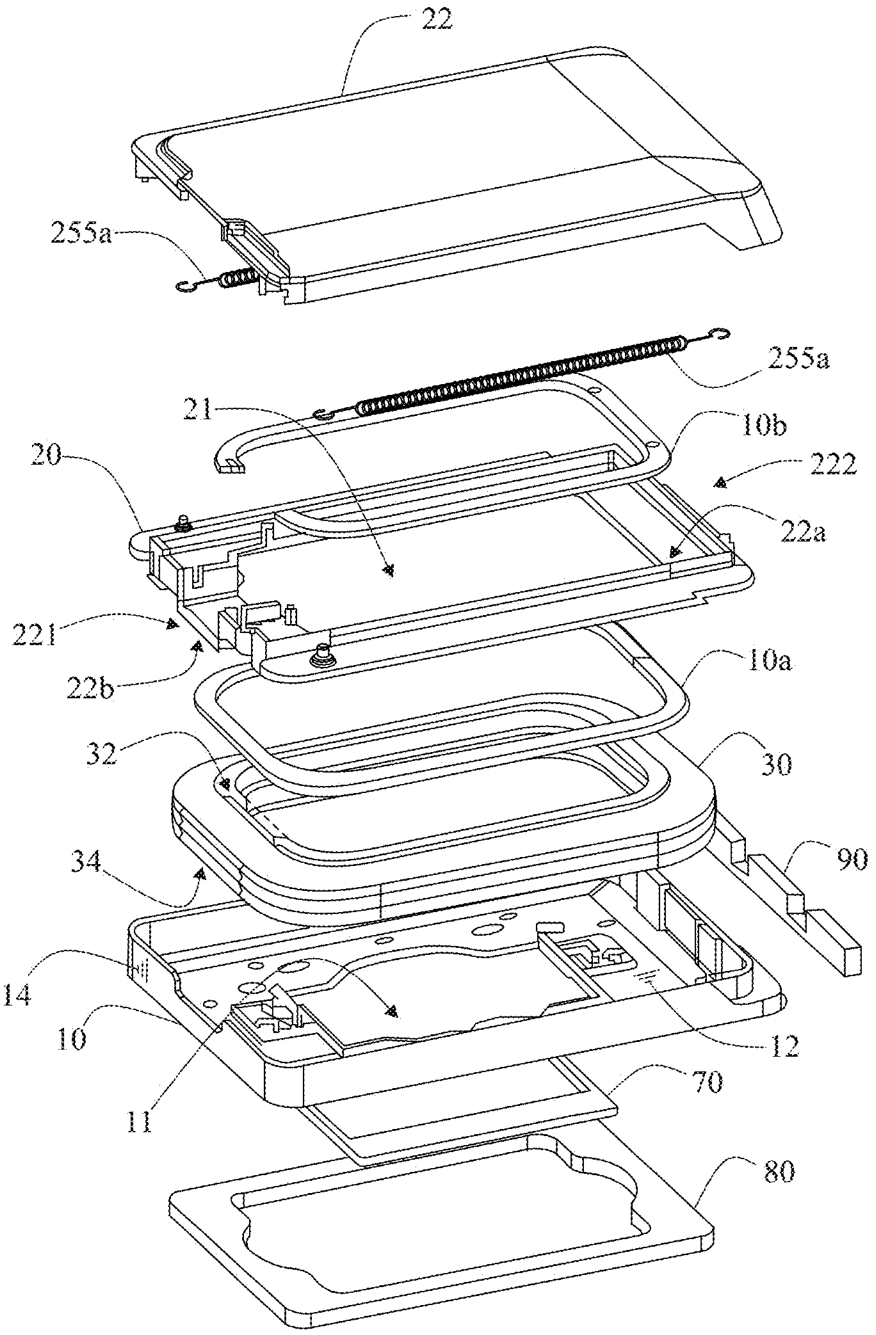
FIG. 4 illustrates an exploded view of the cover assembly for an electrical device in accordance with the present invention.

Referring now to FIG. 4, the base (10) includes a base wall (12), and a sidewall (14) extending from the periphery of the base wall (12) in a direction substantially perpendicular to the base wall (12). The sidewall (14) forms a space to accommodate the flexible element (30). The base (10) is adapted to connect the flexible element (30) on the base wall (12). The flexible element (30) is having a first end (32) and a second end (34). The first end (32) is connected to the base (10) around the opening (11) and the second end (34) is adapted to expand away from the base (10) configuring an extended position (shown in FIG. 5) to accommodate the connector (50).

The second end (34) of the flexible element (30) is connected to the lid (20). The lid (20) includes a lid ring (22) and a cover (24). The lid ring (22) is connected to the flexible element (30) specifically, the lid ring (22) is having a rectangular shape similar to the base (10) and is arranged over the base (10) using the flexible element (30). The lid ring (22) is having a lid aperture (21) provided to access the electrical device (200). Further, the lid ring (22) includes a top surface (22*a*) and a bottom surface (22*b*).

The bottom surface (22*b*) is adapted to connect the second end (34) of the flexible element (30) to the lid ring (22). In an embodiment, the lid ring (22) includes projections adapted to engage with the flexible element (30), especially to engage with the second end (34) of the flexible element (30). In an embodiment, the flexible element (30) is secured with a closure ring (10*a*). The closure ring (10*a*) may have projections which are adapted to engage with corresponding openings (not shown) configured on the flexible element (30). Additionally, the lid ring (22) is having a top closure ring (10*b*) arranged on the top surface of the lid ring (22) and adapted to facilitate the connection of the flexible element (30) along with the closure ring (10*a*). The flexible element (30) is adapted to move the lid (20) away from the base (10) to configure the extended position and to retract the lid (20) towards the base (10) to configure a retracted position (shown in FIG. 2).

The extended position of the flexible element (30) is configured to form a space to accommodate the connector (50) connected to the electrical device (200). In the retracted position the flexible element (30) is flushed within the base (10).

Figure 6A:
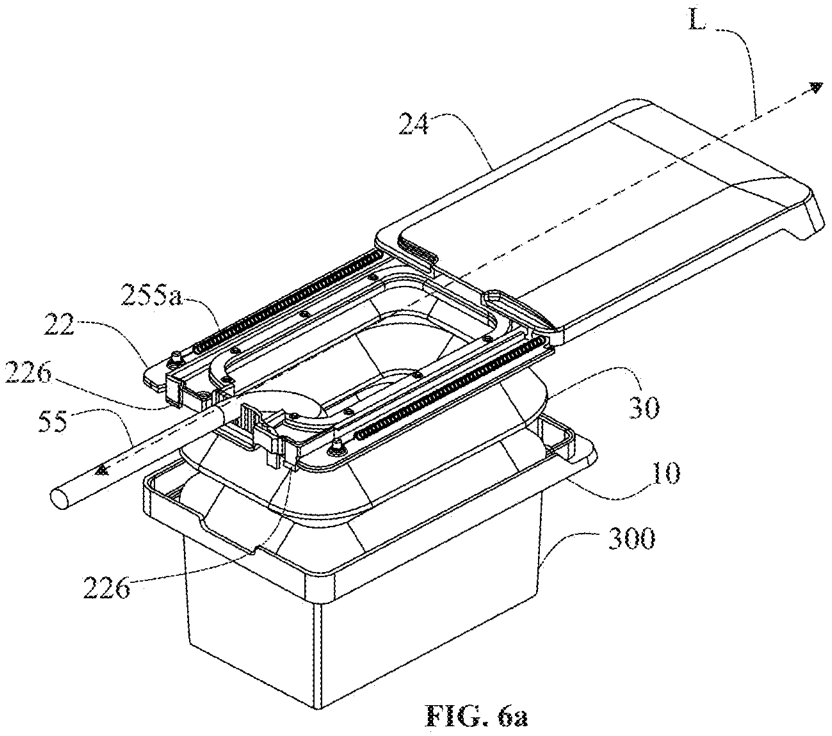
FIG. 6*a* illustrates a perspective view of the cover assembly with the flexible element configured in the expanded position and the cover in the open lid position.
Figure 6B:
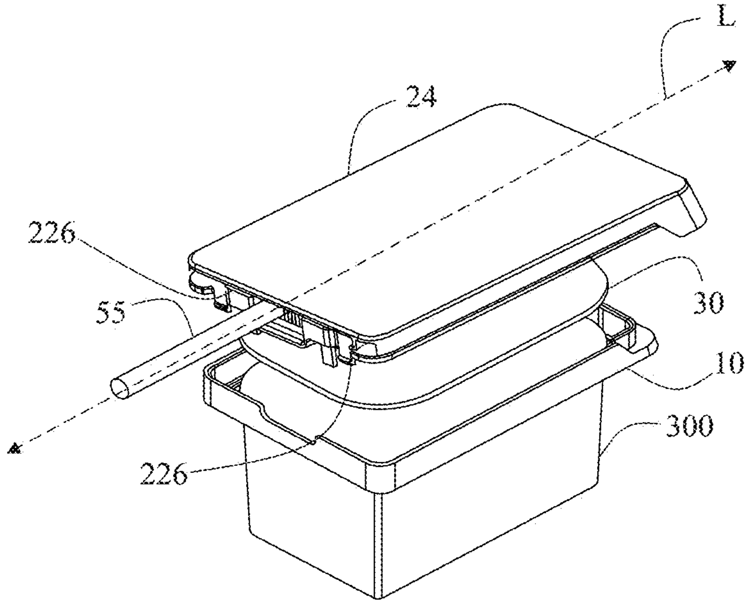
FIG. 6*b* illustrates a perspective view of the cover assembly with the flexible element configured in the expanded position and the cover in the closed lid position.

Referring now to FIGS. 4, 6*a*, and 6*b*, the lid ring (22) includes a slide mechanism (25) to facilitate an open lid position (shown in FIG. 6*a*) or a closed lid position (shown in FIG. 6*b*) of the cover (24). The lid ring (22) includes a first longitudinal end (221) and a second longitudinal end (222) arranged opposite to the first longitudinal end (221) and is separated by the lid aperture (21). The cover (24) is arranged on the lid ring (22) and slidable in a longitudinal direction (L) to configure the open lid position to access the electrical device (200) through the lid aperture (21), and the closed lid position to close the lid aperture (21) when the cover assembly (100) is in use. The closed lid position facilitates the protection of the connector (50) and the electrical device (200) from outer environmental and weather conditions.

Specifically, the top surface of the lid ring (22) is adapted to receive the cover (24) and enable the movement of the cover (24) along the longitudinal direction (L) of the lid ring (22) using the slide mechanism (25). The slide mechanism (25) includes a guide arranged on the lid ring (22), and an engaging portion provided on the cover (24) to engage with the guide. In the present embodiment, the lid ring (22) includes a vertical wall extending in a perpendicular direction from the top surface of the lid ring (22) to configure the guide thereon. The guide is a channel or other construction that facilitates the sliding of the cover (24) on the lid ring (22).

In the present embodiment, the lid ring (22) includes two vertical walls aligned along the longitudinal direction (L), separated by the lid aperture (21). The engaging portion of the cover (24) is adapted to slidably engage with the guide configured on the vertical wall. The slide mechanism (25) is a slot and slider mechanism, wherein the guide arranged on the lid ring (22) is a slot, and the engaging portion arranged on the cover (24) is a slider. It may be obvious for a person skilled in the art to configure any other mechanism to facilitate the sliding movement of the cover (24) on the lid ring (22).

Further, the slide mechanism (25) includes a biasing member (255) arranged between the lid ring (22) and the cover (24) to bias the cover (24) in the closed lid position. The cover (24) is movable towards the open lid position upon applying an external force on the cover (24), and the biasing member (255) enables the movement of the cover (24) towards the closed lid position upon removal of the external force. The biasing member (255) includes at least one spring with one end connected to the lid ring (22) and another end connected to the cover (24) in such a way that the cover (24) is biased in the closed lid position.

In this embodiment, the spring is a tension spring (255*a*) with one end fixed at a first longitudinal end (221) of the lid ring (22) through a pin (2201), and another end is connected to an edge of the cover (24) that is near the first longitudinal end (221) of the lid ring (22). The cover (24) is movable in the longitudinal direction (L) to configure the open lid position by overcoming a biasing force of the tension spring (255*a*). Upon removal of the external force from the cover (24), the tension spring (255*a*) exerts a pulling force on the cover (24) to slide the cover (24) towards the first longitudinal end (221) of the lid ring (22), thereby configuring the closed lid position.

In an alternative embodiment (not shown), the spring is a compression spring with one end fixed at a second longitudinal end (222) of the lid ring (22), and another end is connected to an edge of the cover (24) near the first longitudinal end (221) of the lid ring (22), thereby exerting a pushing force on the cover (24) to configure the closed lid position. The cover (24) is movable in the longitudinal direction (L) to configure the open lid position by overcoming a biasing force of the compression spring. Upon removal of the external force from the cover (24) in the open lid position, the compression spring exerts a pushing force on the cover (24) to slide the cover (24) towards the first longitudinal end (221) of the lid ring (22), thereby configuring the closed lid position.

Further, in the present embodiment, the lid ring (22) includes a cord port (60) configured on a side portion of the lid ring (22) to accommodate the cord (55) of the connector (50) once the cover (24) is in the closed lid position (as shown in FIG. 6*b*).

Figure 5:
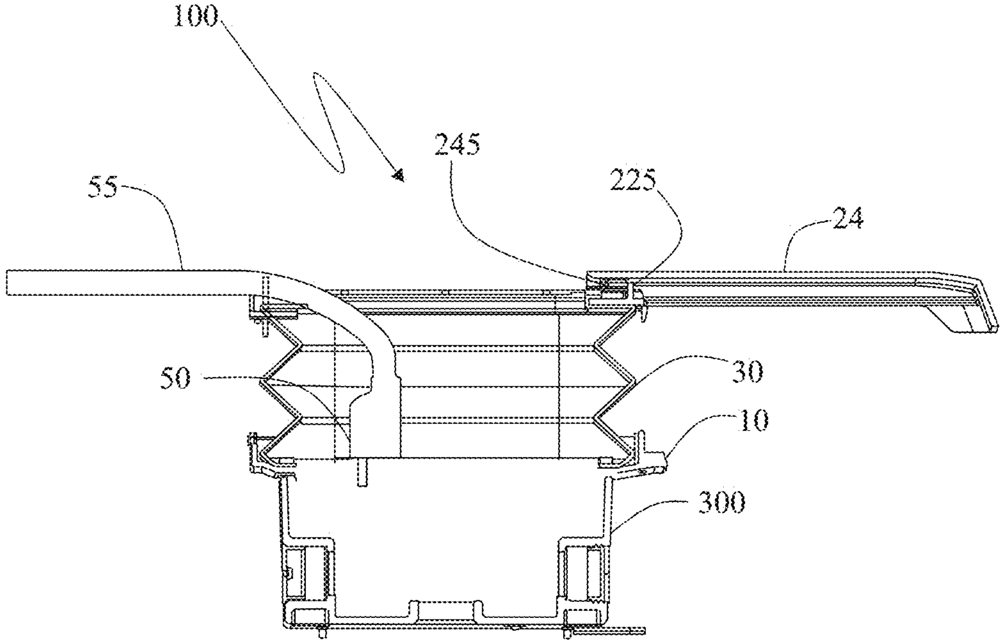
FIG. 5 illustrates a sectional side view of the cover assembly for an electrical device with a flexible element configured in the expanded position and a cover in the open lid position.

Referring now to FIG. 5, the cover (24) includes a stopper (245) arranged at an edge to restrict the movement of the cover (24) at the open lid position while moving in the longitudinal direction (L) from the closed lid position.

The stopper (245) is provided at a portion of the lid (20) to restrict the sliding movement of the cover (24) beyond a certain limit. The stopper (245) is provided to engage with a protruded region (225) of the lid ring (22) when moving from the closed lid position to configure the open lid position and prevent further sliding movement of the cover (24).

Figure 7:
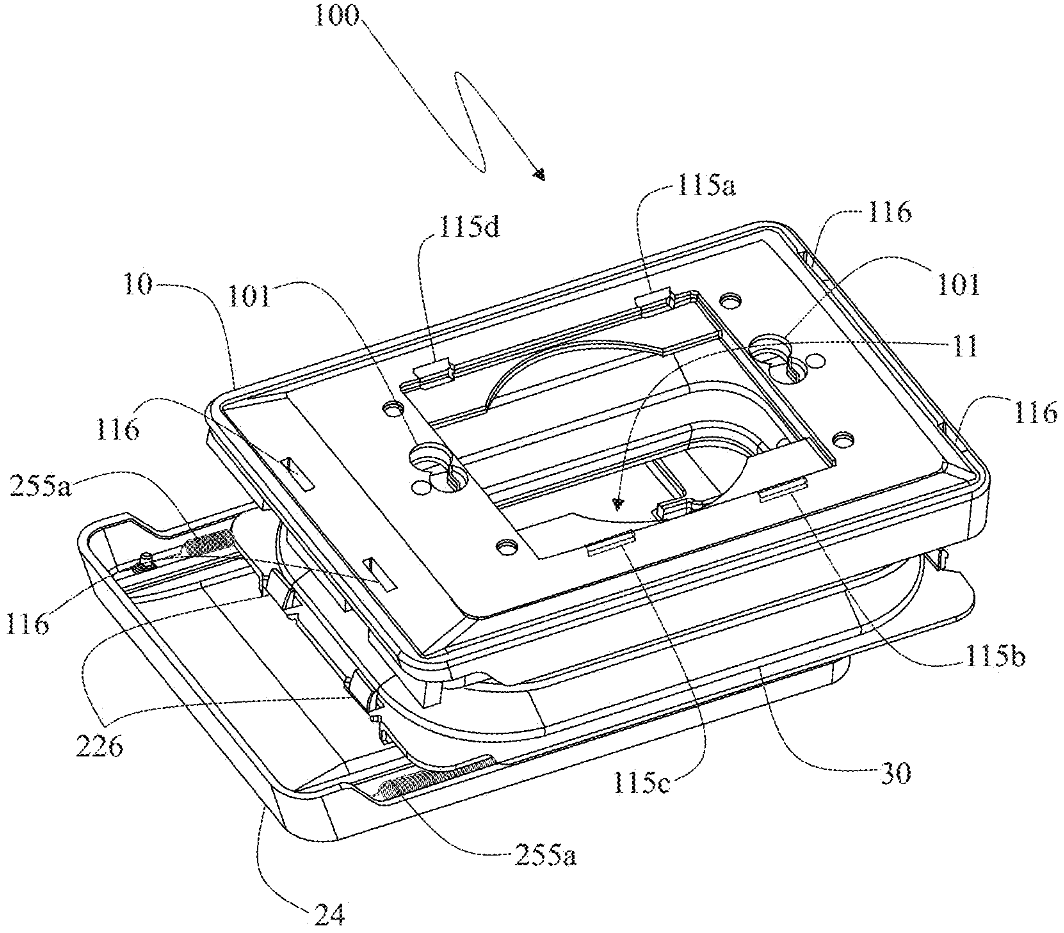
FIG. 7 illustrates a back view of the cover assembly showing tabs arranged on a rear face of a base.

Referring now to FIG. 7, in the present embodiment, the lid ring (22) includes at least one engagement tab (226) configured to engage with at least one locking tab (116) arranged on the base (10) to attach the lid (20) to the base (10) in the retracted position to secure the flexible element (30) within the base (10). The engagement tab (226) extends from the bottom surface (22*b*) of the lid ring (22) towards the base (10) and has a shape configured to engage with the locking tab (116) of the base (10). The locking tab (116) is a slot provided on the base wall (12) of the base (10) to receive the engagement tab (226) therein. The engagement tab (226) and the locking tab (116) are locked with each other to flush the flexible element (30) within the base (10) (shown in FIG. 2) when the electrical device (200) is not in use.

Figure 8:
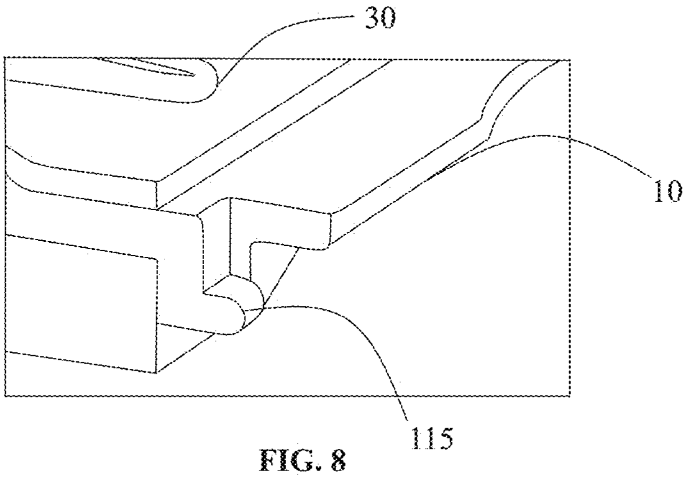
FIG. 8 illustrates an enlarged view of a tab arranged on the base of the cover assembly.

Referring again to FIGS. 7, and 8, the cover assembly (100) includes an adapter plate (70) attachable to the base (10). The adapter plate (70) includes at least one opening to receive at least one electrical device (200). Specifically, the adapter plate (70) is coupled to a rear face of the base (10) and is sandwiched between the base (10) and the electrical device (200) when the cover assembly (100) is attached to the electrical device (200).

Figure 9A:
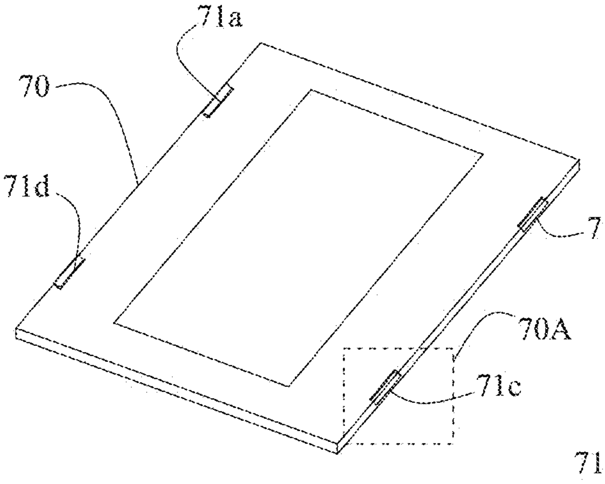
FIG. 9*a* illustrates a perspective view of an adapter plate of the cover assembly in accordance with the present invention.
Figure 9B:
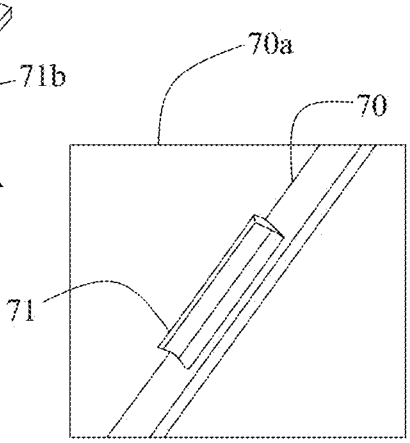
FIG. 9*b* illustrates an enlarged view of a recessed portion of the adopter plate, as shown in FIG. 9*a;*
Figure 10:
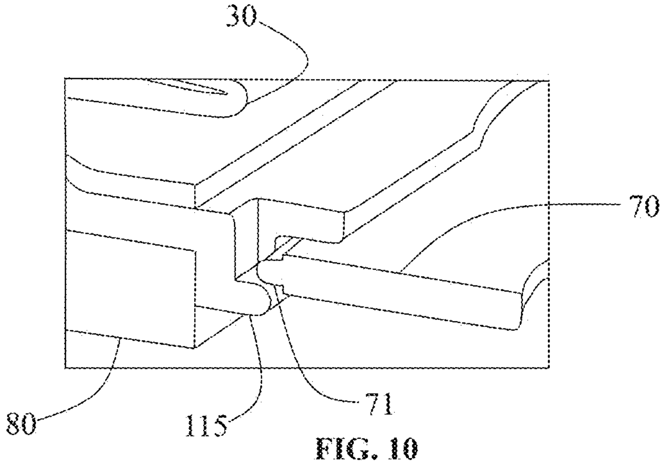
FIG. 10 illustrates an enlarged view of the adopter plate attached to the base through the tab and recessed portion arrangement.

Further, the base (10) includes at least one tab (115) extending from the rear face around the opening (11) to secure the adapter plate (70) thereon. The adapter plate (70) includes at least one recessed portion (71) (shown in FIGS. 9*a*, and 9*b*) corresponding to the tab (115) arranged on the base (10) to allow insertion of the adapter plate (70) within the tab (115) thereby attaching the adapter plate (70) to the rear face of the base (10). The recessed portion (71) is a curved notch-like structure provided on a sidewall of the adapter plate (70) to slide in through a gap between the tab (115) and the rear face of the base (10). The recessed portion (71) is surrounded by the tab (115) of the base (10) in an attached position (shown in FIG. 10) of the adapter plate (70). In the present embodiment, the base (10) includes four tabs (115*a*, 115*b*, 115*c*, 115*d*), and the adapter plate (70) includes four recessed portions (71*a*, 71*b*, 71*c*, 71*d*) that are arranged corresponding to the four tabs (115*a*, 115*b*, 115*c*, 115*d*) of the base (10). Each longitudinal side of the base (10) includes two tabs and each longitudinal side of the adapter plate (70) includes two recessed portions corresponding to the position of the two tabs of the base (10).

Figure 11:
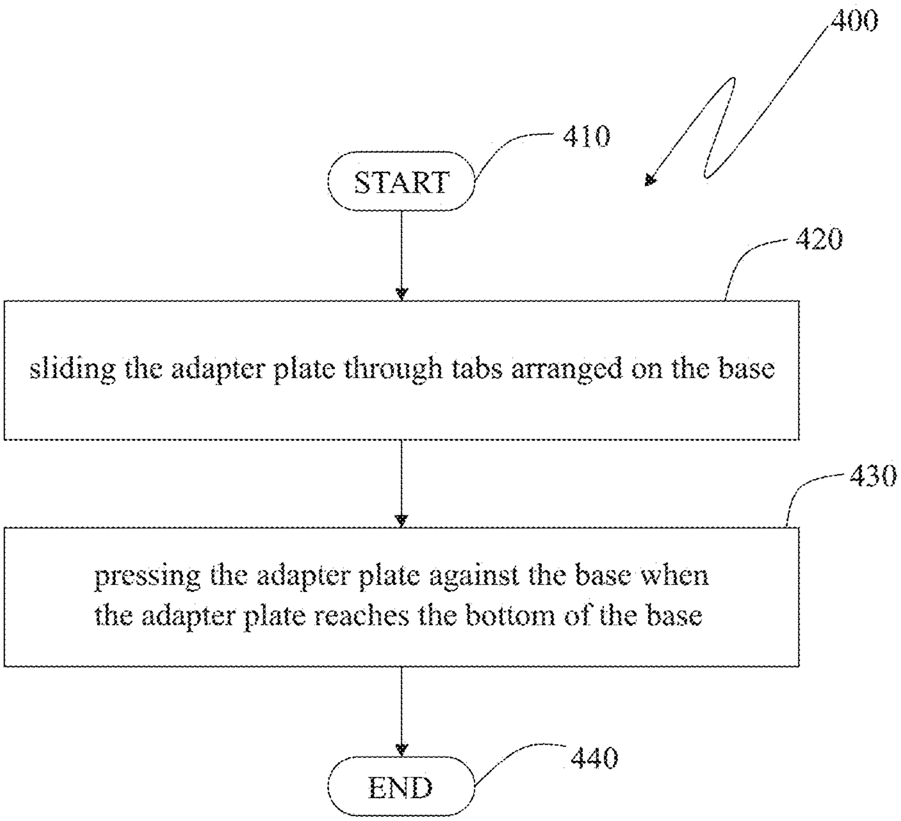
FIG. 11 illustrates a flowchart of a method to attach the adapter plate to the base in accordance with the present invention of the invention.

Referring now to FIG. 11, a method (400) is provided to attach the adapter plate (70) to the base (10). The method (400) includes steps of:

The method (400) starts at step (410).

At step (420), the adapter plate (70) is adapted to slide into the two tabs of the base (10) and makes contact with the corresponding two recessed portions of the adapter plate (70). The adapter plate (70) reaches the bottom of the base (10) and the remaining two recessed portions are aligned over the remaining two tabs of the base (10).

At step (430), when the adapter plate (70) reaches the bottom of the base (10), the adapter plate (70) is pressed against the base (10). By applying an external force on the adapter plate (70) specifically on the remaining recessed portions against the base (10), the adapter plate (70) moves through the two tabs and attaches to the base (10) with two recessed portions of the adapter plate (70) surrounded by the corresponding two tabs of the base (10).

The method (400) ends at step (440).

Referring now to FIGS. 4 and 7, the cover assembly (100) includes a gasket (80) arranged below the base (10) to prevent leakage and ingress of dust particles, water, oils, chemicals and the like. Specifically, the gasket (80) is attached to the rear face of the base (10) and is in contact with the electrical device (200) or the electrical box (300) to provide sealing between the cover assembly (100) and the electrical device (200).

Further, the cover assembly (100) includes a lid gasket (90). The lid gasket (90) is arranged on one side of the base (10) to provide tight sealing of the lid (20) to the base (10) when the flexible element (30) is in the retracted position or when the cover assembly (100) is not in use.

Therefore, the advantage of the present invention is to provide a cover assembly (100) for an electrical device (200). The cover assembly (100) provides easy accessibility of the electrical device (200) to the user. Also, the cover assembly (100) protects the electrical device (200) from environmental hazards. Further, the cover assembly (100) is easy to install and use.

The foregoing descriptions of specific embodiments of the present invention have been presented for purposes of illustration and description. They are not intended to be exhaustive or to limit the present invention to the precise forms disclosed, and obviously, many modifications and variations are possible in light of the above teaching. The embodiments were chosen and described in order to explain the principles of the present invention best and its practical application, to thereby enable others skilled in the art to best utilise the present invention and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present invention.

We claim:

1. A cover assembly (100) for an electrical device (200) comprising:

a base (10) adapted to be attached to the electrical device (200), the base (10) is having an opening (11) to receive the electrical device (200) there through;

a lid (20) having a lid ring (22) and a cover (24), wherein the cover (24) is slidably arranged on the lid ring (22) using a slide mechanism (25) to configure an open lid position or a closed lid position; and a flexible element (30) arranged between the base (10) and the lid ring (22) of the lid (20), the flexible element (30) is adapted to move the lid (20) away from the base (10) to configure an extended position, forming a space to accommodate a connector (50) connected to the electrical device (200), and to retract the lid (20) towards the base (10) to configure a retracted position and flush the flexible element (30) within the base (10).

2. The cover assembly (100) as claimed in claim 1, wherein the slide mechanism (25) includes a guide arranged on the lid ring (22), and an engaging portion provided on the cover (24) to engage with the guide of the lid ring (22) to enable sliding of the cover (24) in a longitudinal direction (L).

3. The cover assembly (100) as claimed in claim 1, wherein the cover (24) is slidable from the closed lid position to the open lid position in a longitudinal direction (L) upon applying an external force, and upon releasing the external force, a biasing member (255) enables the cover (24) to move towards the closed lid position from the open lid position.

4. The cover assembly (100) as claimed in claim 3, wherein the biasing member (255) includes at least one spring with one end connected to the lid ring (22) and another end connected to the cover (24) in such a way that the cover (24) is biased in the closed lid position.

5. The cover assembly (100) as claimed in claim 4, wherein the spring is a tension spring (**255*a*) with one end fixed at a first longitudinal end (221) of the lid ring (22), and another end is connected to an edge of the cover (24) near the first longitudinal end (221) of the lid ring (22), thereby exerting a pulling force on the cover (24**) to configure the closed lid position.

6. The cover assembly (100) as claimed in claim 4, wherein the spring is a compression spring with one end fixed at a second longitudinal end (222) of the lid ring (22), and another end is connected to an edge of the cover (24) near a first longitudinal end (221) of the lid ring (22), thereby exerting a pushing force on the cover (24) to configure the closed lid position.

7. The cover assembly (100) as claimed in claim 1, wherein the cover (24) includes a stopper (245) arranged at an edge to restrict the movement of the cover (24) at the open lid position while moving in a longitudinal direction (L) from the closed lid position.

8. The cover assembly (100) as claimed in claim 1, wherein the lid ring (22) includes at least one engagement tab (226) configured to engage with at least one locking tab (116) arranged on the base (10) to secure the flexible element (30) in the retracted position within the base (10).

9. The cover assembly (100) as claimed in claim 1, wherein the base (10) is adapted to receive a gasket (80) on a rear surface, the gasket (80) is attached to the base (10) in such a way that the gasket (80) is in contact with the electrical device (200) to provide the sealing therebetween.

10. A cover assembly (100) for an electrical device (200) comprising:

a base (10) adapted to be attached to the electrical device (200), the base (10) is having an opening (11) to receive the electrical device (200) there through;

a lid (20) having a lid ring (22) and a cover (24), wherein the cover (24) is slidably arranged on the lid ring (22) using a slide mechanism (25) to configure an open lid position or a closed lid position;

a flexible element (30) arranged between the base (10) and the lid ring (22) of the lid (20), the flexible element (30) is adapted to move the lid (20) away from the base (10) to configure an extended position, and to retract the lid (20) towards the base (10) to configure a retracted position, wherein the flexible element (30) is retracted within the base (10); and an adapter plate (70) attachable to the base (10), having at least one opening to receive at least one electrical device (200), wherein the adapter plate (70) is coupled to a rear face of the base (10) and is sandwiched between the base (10) and the electrical device (200) when the cover assembly (100) is attached to the electrical device (200).

11. The cover assembly (100) as claimed in claim 10, wherein the base (10) includes at least one tab (115) extending from the rear face around the opening (11) to secure the adapter plate (70) thereon, wherein the adapter plate (70) includes at least one recessed portion (71) corresponding to the tab (115) arranged on the base (10) to allow insertion of the adapter plate (70) within the tab (115).

12. The cover assembly (100) as claimed in claim 10, wherein the base (10) includes four tabs (115*a*, 115*b*, 115*c*, 115*d*), each longitudinal side of the base (10) includes two tabs, and the adapter plate (70) includes four recessed portions (71*a*, 71*b*, 71*c*, 71*d*), each longitudinal side of the adapter plate (70) includes two recessed portions corresponding to the position of the tabs of the base (10).

13. The cover assembly (100) as claimed in claim 10, wherein the adapter plate (70) is attached to the base (10) by using a method (400) including steps of;

sliding the adapter plate (70) through tabs (115*a*, 115*b*, 115*c*, 115*d*) arranged on the base (10);

pressing the adapter plate (70) against the base (10) when the adapter plate (70) reaches the bottom of the base (10), the adapter plate (70) includes recessed portions (71*a*, 71*b*, 71*c*, 71*d*) configured to facilitate snap-fit with the tabs (115*a*, 115*b*, 115*c*, 115*d*) of the base (10).

14. A cover assembly (100) for an electrical device (200) comprising:

a base (10) adapted to be attached to the electrical device (200), the base (10) is having an opening (11) to receive the electrical device (200) there through;

a lid (20) having a lid ring (22) and a cover (24), wherein the cover (24) is slidably arranged on the lid ring (22) using a slide mechanism (25) to configure an open lid position or a closed lid position; and a flexible element (30) arranged between the base (10) and the lid ring (22) of the lid (20), the flexible element (30) is adapted to move the lid (20) away from the base (10) to configure an extended position, forming a space to accommodate a connector (50) connected to the electrical device (200), and to retract the lid (20) towards the base (10) to configure a retracted position and flush the flexible element (30) within the base (10);

wherein, the slide mechanism (25) includes a guide arranged on the lid ring (22), and an engaging portion provided on the cover (24) to engage with the guide of the lid ring (22) to enable sliding of the cover (24) in a longitudinal direction (L), wherein the cover (24) is slidable from the closed lid position to the open lid position in a longitudinal direction (L) upon applying an external force, and upon releasing the external force, a biasing member (255) enables the cover (24) to move towards the closed lid position from the open lid position.

* * * * *